(12) United States Patent
Avni et al.

(10) Patent No.: US 8,222,964 B2
(45) Date of Patent: Jul. 17, 2012

(54) SYSTEM, METHOD AND APPARATUS EMPLOYING CRYSTAL OSCILLATOR

(75) Inventors: Noam Avni, Jerusalem (IL); Amit Zeevi, Ra'anana (IL); Yavir Navot, Naharia (IL); Motti Haller, Haifa (IL)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 12/164,442

(22) Filed: Jun. 30, 2008

(65) Prior Publication Data

US 2009/0322437 A1    Dec. 31, 2009

(51) Int. Cl.
*H03B 5/32* (2006.01)
(52) U.S. Cl. .............. 331/158; 331/116 R; 331/116 FE; 331/108 C; 310/344; 310/348
(58) Field of Classification Search ................. 331/158, 331/116 R, 116 FE, 108 C; 310/344, 348
See application file for complete search history.

(56) References Cited

U.S. PATENT DOCUMENTS

| | | | |
|---|---|---|---|
| 6,512,680 B2 * | 1/2003 | Harada et al. ................. | 361/777 |
| 6,531,807 B2 * | 3/2003 | Tanaka et al. ................. | 310/344 |
| 6,545,346 B2 | 4/2003 | Figueroa et al. | |
| 6,558,169 B2 | 5/2003 | Figueroa et al. | |
| 6,627,978 B2 | 9/2003 | Dujari et al. | |
| 7,135,810 B2 * | 11/2006 | Okajima ....................... | 310/348 |
| 7,348,859 B2 * | 3/2008 | Yamamoto ..................... | 331/61 |
| 7,382,204 B2 * | 6/2008 | Arai et al. ..................... | 331/69 |
| 2005/0145885 A1 | 7/2005 | He et al. | |
| 2005/0146003 A1 | 7/2005 | O'Connor et al. | |
| 2006/0073632 A1 | 4/2006 | Garcia | |
| 2006/0082353 A1 | 4/2006 | Solivan et al. | |
| 2006/0091564 A1 | 5/2006 | Zhong et al. | |
| 2006/0091868 A1 | 5/2006 | Wickersham | |
| 2006/0138639 A1 | 6/2006 | Figueroa et al. | |
| 2007/0075405 A1 | 4/2007 | Ye | |

OTHER PUBLICATIONS

"82575 Gigabit Ethernet Controller Design Guide V1.00", Jun. 2007, 317698-001, Intel, (total 56 pages, including para 4.0, 5.0, 5.5 and 5.11).
82575 Gigabit Ethernet Controller Datasheet v1.00, Jun. 2007, 317697-001, Intel, (total 69 pages, including para 3.9).
"82566 Gigabit Platform LAN Connect Networking Silicon Datasheet", Revision 1.5, Mar. 2006, Intel, (total 28 pages, including para 3.6.3).
"Data Sheet for 8Z25020001", Sep. 3, 2006, TXC Corporation, 4pgs.

* cited by examiner

*Primary Examiner* — Arnold Kinkead
(74) *Attorney, Agent, or Firm* — Buckley, Maschoff & Talwalkar LLC

(57) ABSTRACT

In some embodiments, an apparatus and system includes a substrate including outer surfaces, one of the outer surfaces defining a first plurality of electrical contacts, one of the outer surfaces adapted to be mounted to a circuit board and defining a second plurality of electrical contacts adapted to be electrically connected to the circuit board; an integrated circuit die mounted to one of the outer surfaces, and a crystal oscillator mounted to one of the outer surfaces and electrically connected to the integrated circuit die. In some embodiments, a method includes providing a substrate including outer surfaces, one of the outer surfaces defining a first plurality of electrical contacts, one of the outer surfaces adapted to be mounted to a circuit board and defining a second plurality of electrical contacts adapted to be electrically connected to the circuit board; mounting an integrated circuit die to one of the outer surfaces, mounting a crystal oscillator to one of the outer surfaces; and electrically connecting the crystal oscillator to the integrated circuit die.

41 Claims, 4 Drawing Sheets

SYSTEM, METHOD AND APPARATUS EMPLOYING CRYSTAL OSCILLATOR

BACKGROUND

An integrated circuit package may electrically connect an integrated circuit die to external circuitry. For example, some integrated circuit packages are mounted on a printed circuit board and electrically connect the integrated circuit die to external circuitry on the printed circuit board. The external circuitry may include a crystal oscillator that may be used in providing a clock signal for one or more circuits of the integrated circuit die.

Since the characteristics of the clock signal may depend on the type of crystal oscillator used in the external circuitry and on the position of the crystal oscillator relative to the position of the integrated circuit package, the manufacturer of the integrated circuit package may perform testing to confirm that the one or more circuits of the integrated circuit die operate correctly with the various types of crystal oscillators that customers may employ and that the one or more circuits operate correctly with such crystal oscillators in various positions relative to the position of the integrated circuit package.

DETAILED DESCRIPTION

In accordance with some embodiments, an integrated circuit package includes an integrated circuit die and a crystal oscillator. Because the integrated circuit package includes the crystal oscillator, the manufacture of the integrated circuit package may know the type of crystal oscillator that is to be used and/or the position of the crystal oscillator in the integrated circuit package.

Consequently, in some embodiments, the manufacturer of the integrated circuit package may not perform testing to confirm that the one or more circuits of the integrated circuit die operate correctly with the various types of crystal oscillators that customers may have employed if integrated circuit package did not include the crystal oscillator and/or that the one or more circuits operate correctly with such crystal oscillators in various positions relative to the position of the integrated circuit package.

Figure 1:
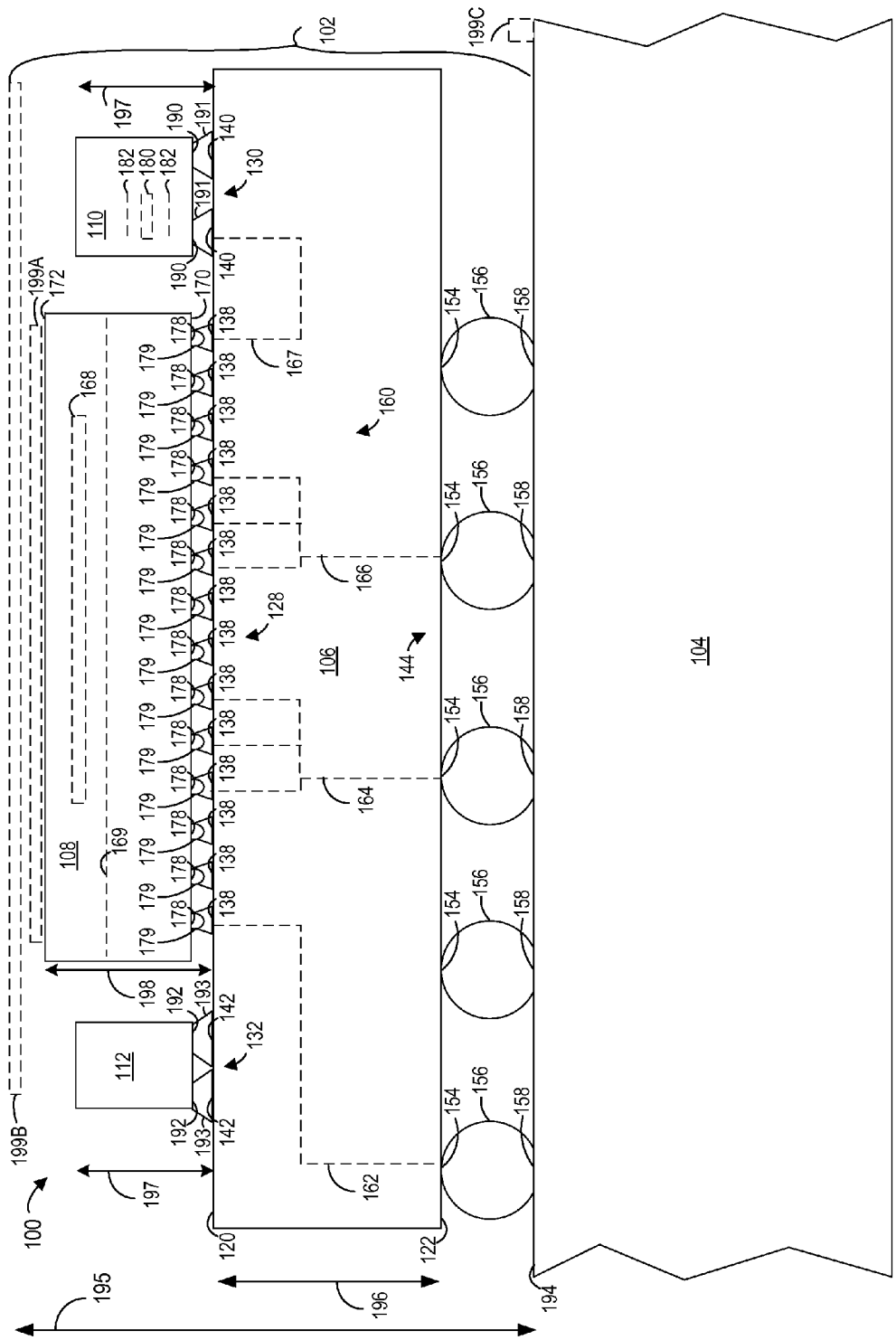
FIG. 1 is a schematic, cutaway, side view of a system according to some embodiments.

Rather, in some embodiments, the manufacturer of the integrated circuit package may choose to only perform testing to confirm that the one or more circuits of the integrated circuit die operate correctly with the known type of crystal oscillator and/or that the one or more circuits operate correctly with the crystal oscillator in the known position. In some embodiments, the manufacturer of the integrated circuit may choose to package the crystal or crystal circuit together with the integrated circuit. In some other embodiments, the manufacturer of the integrated circuit may not choose to package the crystal or crystal circuit together with the integrated circuit FIG. 1 is a schematic, cutaway, side view of a system 100 according to some embodiments. Referring to FIG. 1, the system 100 includes an integrated circuit package 102 and a circuit board 104. The integrated circuit package 102 may include an integrated circuit package substrate 106, an integrated circuit die 108, a crystal oscillator 110 and capacitors 112 (only one of which is shown in FIG. 1).

The integrated circuit package substrate 106 includes a first outer surface 120 and a second outer surface 122. In some embodiments, the first outer surface 120 and the second outer surface 122 are opposite major outer surfaces, for example, as shown.

The first outer surface 120 may define mounting areas 128, 130, 132 on which the integrated circuit die 108, the crystal oscillator 110 and the capacitors 112 are mounted, respectively. Each of the mounting areas 128, 130, 132 may include a plurality of contacts electrically connected to the electrical devices (sometimes referred to herein as components) mounted thereon. In the illustrated embodiment, mounting area 128 includes contacts 138 electrically connected to the integrated circuit die 108. Mounting area 130 includes contacts 140 electrically connected to the crystal oscillator 110. Mounting area 132 includes contacts 142 electrically connected to the capacitors 112.

The second outer surface 122 may overlay a fractional portion of the circuit board 104 and may define a mounting area 144 mounted to the circuit board 104. Such mounting area 144 may include a plurality of contacts 154 electrically connected to the circuit board 104.

In some embodiments, the contacts 154 are arranged in an array sometimes referred to as a land grid array (LGA). In some such embodiments, the contacts 154 and the contacts 158 are arranged in corresponding arrays such that such that each of the contacts 154 is in register with a respective one of the contacts 158. In some embodiments, each of the arrays is a two dimensional array that includes a plurality of rows and a plurality of columns.

In some embodiments, the contacts 154 are soldered directly to the contacts 158 in order to mount and electrically connect the integrated circuit package 102 thereto. In some other embodiments, a socket may be disposed between the contacts 154 and contacts 158.

In some embodiments, ball contacts 156 are joined to the second outer surface 122 of the substrate 106 and soldered to contacts 158 of the circuit board 104 in order to mount and electrically connect the integrated circuit package 102 thereto.

In some embodiments, testing is performed before the integrated circuit package 102 is mounted to the circuit board 104 so as to help avoid waste of resources in the event that the integrated circuit package 102 is defective.

In some embodiments, the ball contacts 156 are arranged in an array sometimes referred to as a ball grid array (BGA). In some embodiments, the contacts 154, the ball contacts 156 and the contacts 158 are arranged in corresponding arrays such that such that each of the contacts 154 is in register with a respective one of the contacts 156 and a respective one of the contacts 158. In some embodiments, each of the arrays is a two dimensional array that includes a plurality of rows and a plurality of columns.

Some of the plurality of contacts 154 electrically connected to the circuit board 104 may conduct signals to and/or from the circuit board 104. Others of the plurality of contacts 154 connected to the circuit board 104 may conduct a supply voltage and/or ground being supplied to the integrated circuit die 108, the crystal oscillator 110 and/or the capacitors 112.

The substrate 106 may further include a plurality of electrical conductors 160 (e.g., traces and/or vias). The plurality of electrical conductors 160 may include electrical conductors to electrically connect one or more of the contacts 138, 140, 142 electrically connected to the integrated circuit die 108, the crystal oscillator 110 and the capacitors 112, respectively, to one or more of the contacts 154 electrically connected to the circuit board 104 (i.e., to electrically connect the integrated circuit die 108 to the circuit board 104).

In some embodiments, for example, the plurality of electrical conductors 160 includes electrical conductors 162, 164, 166. The electrical conductors 162 electrically connect one of the contacts 138 electrically connected to the integrated circuit die 108 to one of the contacts 154 electrically connected to the circuit board 104. The electrical conductors 164 electrically connect a group of the contacts 138 electrically connected to the integrated circuit die 108 to another one of the contacts 154 electrically connected to the circuit board 104. The electrical conductors 166 electrically connect another group of the contacts 138 electrically connected to the integrated circuit die 108 to another one of the contacts 154 electrically connected to the circuit board 104. In some embodiments, the electrical conductors 162 conduct signals to and/or from the circuit board 104. The electrical conductors 164 conduct a supply voltage being supplied to the integrated circuit die 108. The electrical conductors 166 conduct a ground being supplied to the integrated circuit die 108.

The plurality of electrical conductors 160 may also include one or more electrical conductors to electrically connect one or more of the contacts 138 electrically connected to the integrated circuit die 108 to one or more of the contacts 140 electrically connected to the crystal oscillator 110 (to electrically connect the integrated circuit die 108 to the crystal oscillator 110). In some embodiments, for example, the plurality of electrical conductors 160 includes electrical conductors 167. The electrical conductors 167 electrically connect one of the contacts 138 electrically connected to the integrated circuit die 108 to one of the contacts 140 electrically connected to the crystal oscillator 110.

Although not shown in FIG. 1, the plurality of electrical conductors 160 may also include one or more electrical conductors to electrically connect one or more of the contacts 142 electrically connected to the capacitors 112 to one or more of the contacts 138 electrically connected to the integrated circuit die 108 (to electrically connect the capacitor 112 to the integrated circuit die 108), to one or more of the contacts 140 electrically connected to the crystal oscillator 110 (to electrically connect the capacitor 112 to the crystal oscillator 110) and/or to one or more of the contacts 154 electrically connected to the circuit board 104 (i.e., to electrically connect the capacitor 112 to the circuit board 104).

As further described below, in some embodiments, the capacitors 112 include two capacitors 112A, 112B (FIG. 3) in a circuit that provides a clock signal for one or more circuits of the integrated circuit die 108. In some embodiments, one, some, or all others of the capacitors 112 comprise a decoupling capacitor electrically connected between the supply voltage and ground.

The integrated circuit die 108 may include one or more integrated circuits, e.g., circuit 168 disposed on a substrate 169. The one or more integrated circuits 168 may comprise active and/or passive components. The substrate 169 may comprise any type of substrate, and in some embodiments, comprises a silicon and/or other type of semiconductor substrate.

The integrated circuit die 108 includes a first outer surface 170 and a second outer surface 172. In some embodiments, the first outer surface 170 and the second outer surface 172 are opposite major outer surfaces, for example, as shown. The first outer surface 170 may define a plurality of contacts 178 electrically connected to one or more of the one or more integrated circuits 168 of the integrated circuit die 108.

As stated above, the integrated circuit die 108 may be mounted to the first outer surface 120 of the substrate 106. In some embodiments, bump contacts 179 are joined to the contacts 178 of the integrated circuit die 108 and soldered to the contacts 138 of the substrate 106 in order to mount and electrically connect the integrated circuit die 108 thereto. In some embodiments, testing is performed before the integrated circuit die-bump contact assembly is mounted to the substrate 106 so as to help avoid waste of resources in the event that the integrated circuit die 108 is defective.

In some embodiments, the contacts 138, the contacts 178 and the bump contacts 179 are arranged in corresponding arrays such that such that each of the contacts 138 is in register with a respective one of the contacts 178 and a respective one of the bump contacts 179. In some embodiments, each of the arrays is a two dimensional array that includes a plurality of rows and a plurality of columns. The number of rows in each array and/or the number of columns in each array may depend at least in part on a number of contacts 138 that may be desired for the integrated circuit die 108.

In some embodiments, the integrated circuit package 102 may include wirebond type connections (sometimes referred to herein as bond wires) to the integrated circuit die 108 in lieu of and/or in addition to the bump contacts 179. In some embodiments, testing is performed before the integrated circuit die is mounted to the substrate 106 so as to help avoid waste of resources in the event that the integrated circuit die 108 is defective.

The crystal oscillator 110 may comprise a resonator 180 disposed between two or more electrodes 182. In some embodiments, the resonator 180 may comprise a quartz crystal and/or other type of piezoelectric material. The crystal oscillator 110 may include one or more contacts 190 electrically connected to one or more of the electrodes of the crystal oscillator 110.

The contacts 190 of the crystal oscillator 110 may be soldered 191 to the contacts 140 of the substrate 106 in order to mount and electrically connect the crystal oscillator 110 thereto.

Likewise, the contacts 192 of the capacitors 112 may be soldered 193 to the contacts 142 of the substrate 106 in order to mount and electrically connect the capacitors 112 thereto.

The circuit board 104 includes a first outer surface 194. In some embodiments, the first outer surface 194 comprises a first major outer surface. The first outer surface 194 may define the plurality of contacts 158 electrically connected to the integrated circuit package 102.

The circuit board 104 may comprise any type of circuit board. In some embodiments, the circuit board 104 comprises a multi-layer laminate that is rigid and/or at least substantially rigid so as to provide support for the components mounted thereon. In some embodiments, the circuit board 104 comprises a printed circuit board. In some embodiments, the circuit board 104 comprises a processor board and/or a motherboard.

In some embodiments, the circuit board 104 is attached to a chassis (not shown) or some other structure (not shown).

In some embodiments, one or more components of the integrated circuit package 102 are selected so as to keep the overall dimensions of the integrated circuit package 102 within predetermined limits. In some embodiments, for example, the integrated circuit package 102 has a height 195 (e.g., measured from the first outer surface 194 of the circuit board 104) of not greater than 2.85 millimeters (mm). In some embodiments, the substrate 106 has a thickness 196 of about 1.17 mm. The crystal oscillator 110 and the capacitors 112 may have a outer surface positioned at a height 197 of about 0.7 mm from the first outer surface 120 of the substrate 106. The integrated circuit die 110 may have a second outer surface 172 positioned at a height 198 of about 0.85 mm from the first outer surface 120 of the substrate 106.

In some embodiments, the crystal oscillator 110 comprises a crystal oscillator in a small surface mount device package. In some embodiments, the crystal oscillator 110 may have a length of about 2.5 mm, a width of about 2 mm and a height of about 0.5 mm. In some other embodiments, the crystal oscillator 110 may have a length of about 2 mm, a width of about 1.6 mm and a height of about 0.5 mm. In some embodiments, the crystal oscillator 110 comprises a DSX221S series crystal oscillator manufactured by KDS, a R2520 series crystal oscillator manufactured by Raltron a NX2016AA series crystal oscillator manufactured by NDK Corporation, an 8Z series crystal oscillator manufactured by TXC Corporation or an 8Y series crystal oscillator manufactured by TXC Corporation.

In some embodiments, the crystal oscillator is the same and/or similar to one of the above crystal oscillators except that the crystal oscillator may have an operating temperature range that extends to 115 degrees C.

In some embodiments, the system 100 further includes a heat sink 199A, which may improve thermal conductivity between the system 100 and a surrounding environment in which the system may be employed, and may thereby help make it possible for the system to deliver greater performance (e.g., speed) all else being equal. In some embodiments, the heat sink 199A comprises a one piece, integrally formed, "finned" heat sink. The fins, which may have any size and shape, may improve thermal conductivity between the heat sink 199A and the surrounding environment. In some embodiments, the heat sink 199A comprises metal so as to help provide a high thermal conductivity. In some embodiments, the heat sink 199A may be attached to one or more other structures (not shown).

In some embodiments, the heat sink 199A has a height of about 11 mm (including any ribs) and a width that is slightly greater than the width of the integrated circuit package substrate 106. The integrated circuit package may further include mechanical clips (not shown) that mechanically connect the heat sink 199A to the circuit board 104.

In some embodiments, a thermal interface material (TIM) having glue like characteristics and thermal grease like characteristics (not shown) may be disposed between the integrated circuit die 108 and the heat sink 199A. In some embodiments, such thermal interface material is used to mount the heat sink 199A to the integrated circuit die 108 and/or to another portion of the integrated circuit package 102.

In some embodiments, the integrated circuit package 102 may include a lid 199B. In some embodiments, the lid 199B and the substrate 106 collectively define a hermetically seal around the integrated circuit die 108, the crystal oscillator 110 and the capacitors 112.

Although the substrate 106, the integrated circuit die 108, the crystal oscillator 110, and the capacitors 112 are shown having a surface mountable form, in some embodiments, the substrate 106, the integrated circuit die 108, the crystal oscillator 110, and/or the capacitors 112 may not have a surface mountable form.

As stated above, in some embodiments, the integrated circuit package 102 may include wirebond type connections to the integrated circuit die 108 in lieu of and/or in addition to the bump contacts 179. In some such embodiments, the integrated circuit package 102 may include the lid 199B.

In some embodiments, the system 100 further includes memory 199C. In some embodiments, memory 199C is mounted to circuit board 104. In some embodiments, the integrated circuit die 108 is electrically connected to the memory 199C. In some embodiments, the integrated circuit die 108 is electrically connected to the memory 199C via a memory bus (not shown).

In some embodiments, the memory 199C may comprise any type of memory for storing data, such as a Single Data Rate Random Access Memory, a Double Data Rate Random Access Memory, or a Programmable Read Only Memory.

In some embodiments, a plurality of integrated circuit packages 102 are mounted on a single printed circuit board 104.

In some embodiments, the integrated circuit die 108, the crystal oscillator 110, the capacitors 112 and/or one or more other components of an integrated circuit package 102 are mounted to the second outer surface of the substrate 106 instead of to the first outer surface 120 of the substrate. In such embodiments, the second outer surface 122 may define one or more of the mounting areas 128, 130, 132 on which the integrated circuit die 108, the crystal oscillator 110 and the capacitors 112 are mounted, respectively. Each of the mounting areas 128, 130, 132 may include a plurality of contacts electrically connected to the electrical devices mounted thereon. In some embodiments, mounting area 128 includes contacts 138 electrically connected to the integrated circuit die 108, mounting area 130 includes contacts 140 electrically connected to the crystal oscillator 110, and mounting area 132 includes contacts 142 electrically connected to the capacitors 112.

Figure 2:
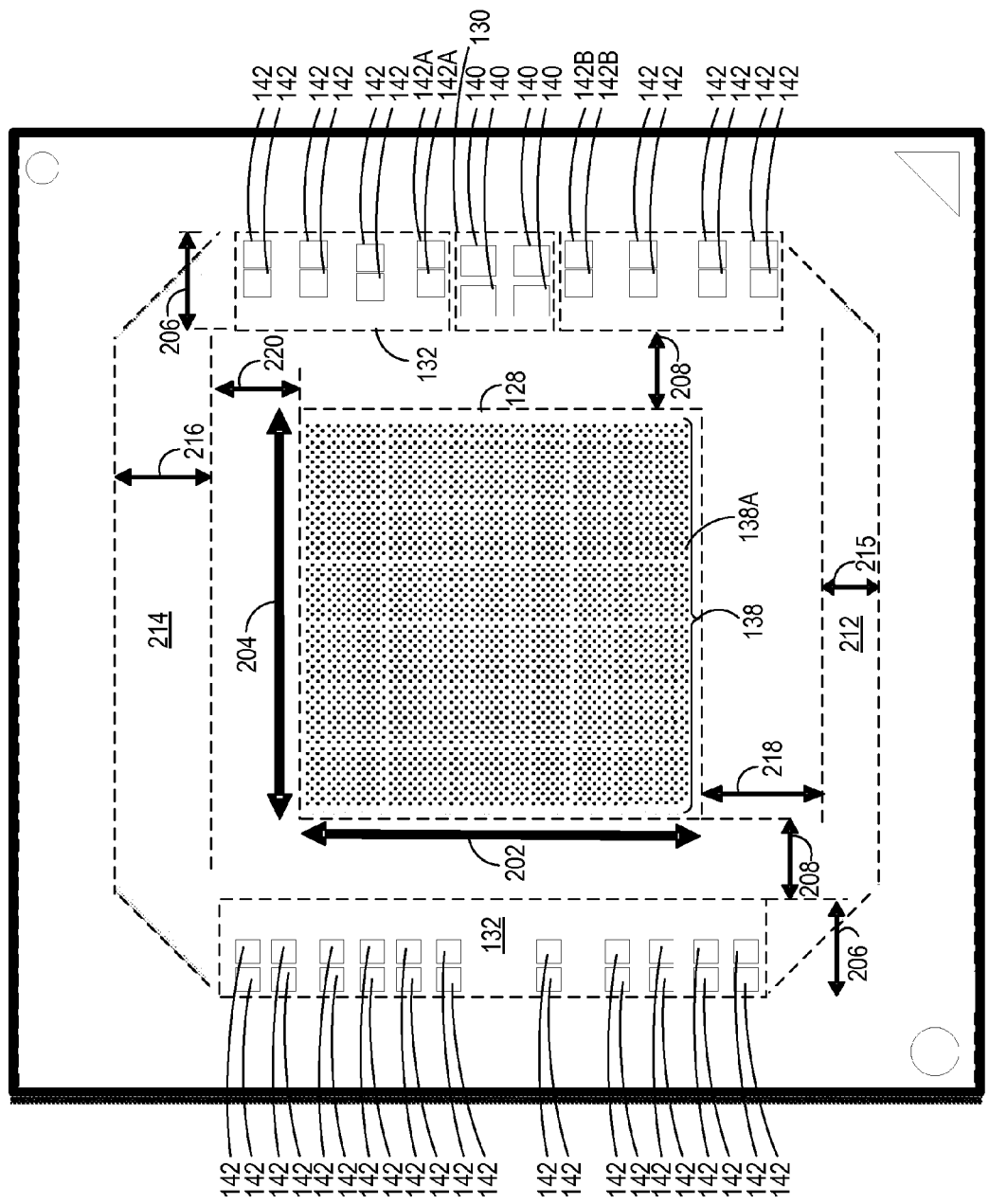
FIG. 2 is a schematic plan view of a substrate according to some embodiments.

FIG. 2 is a schematic plan view of the substrate 106, according to some embodiments. Referring to FIG. 2, in accordance with some embodiments, the mounting area 128 for the integrated circuit die 108 may have a length 202 of about 10.5 mm and a width 204 of about 10.5 mm. The mounting area 130 for the crystal oscillator 110 and the mounting area 132 for the capacitors may each have a width 206 of about 2.7 mm. A distance 208 between the mounting area 128 for the integrated circuit die 108 and the mounting areas 130, 132 may be about 2 mm.

The first outer surface 120 of the substrate 106 may further define areas 212, 214. The area 212 may have a width 215 of about 1.7 mm. The area 214 may have a width 216 of about 2.7 mm. A distance 218 between the mounting area 128 for the integrated circuit die 108 and the area 212 may be about 3 mm. A distance 220 between the mounting area 128 for the integrated circuit die 108 and the area 214 may be about 2 mm.

In some embodiments, the contacts 142 include two pairs of contacts 142A, 142B, to mount and electrically connect two capacitors 112A, 112B (FIG. 3), respectively, to the substrate 106. As further described below, in some embodiments, the two capacitors 112A, 112B (FIG. 3) are used in a circuit (FIG. 3) that provides a clock signal for one or more circuits of the integrated circuit die 108.

As stated above, in the illustrated embodiment, mounting area 128 includes contacts 138. The contacts 138 are represented by circles however the contacts 138 may have any configuration. Reference numeral 138A identifies one of the contacts 138.

In some embodiments, some of the contacts 138 may conduct signals to and/or from the integrated circuit die 108 and may be disposed near and/or along the four edges of the mounting area 128. In some embodiments, others of the contacts 138 may conduct a supply voltage and/or ground being supplied to the integrated circuit die 108.

In some embodiments, one or more of the contacts used in mounting one or more of the components may not be electrically connected to anything within the component. Rather, such contacts may be used for mounting purposes only.

In some embodiments, the crystal oscillator 110 may have four electrical contacts. In some of such embodiments, two of the electrical contacts may be electrically connected to respective electrodes 182 of the crystal oscillator 110. The other two electrical contacts may be electrically connected to the case of the crystal oscillator 110 and/or to nothing at all of the crystal oscillator 110. In some embodiments, the latter two contacts may be primarily for mounting purposes.

Figure 3:
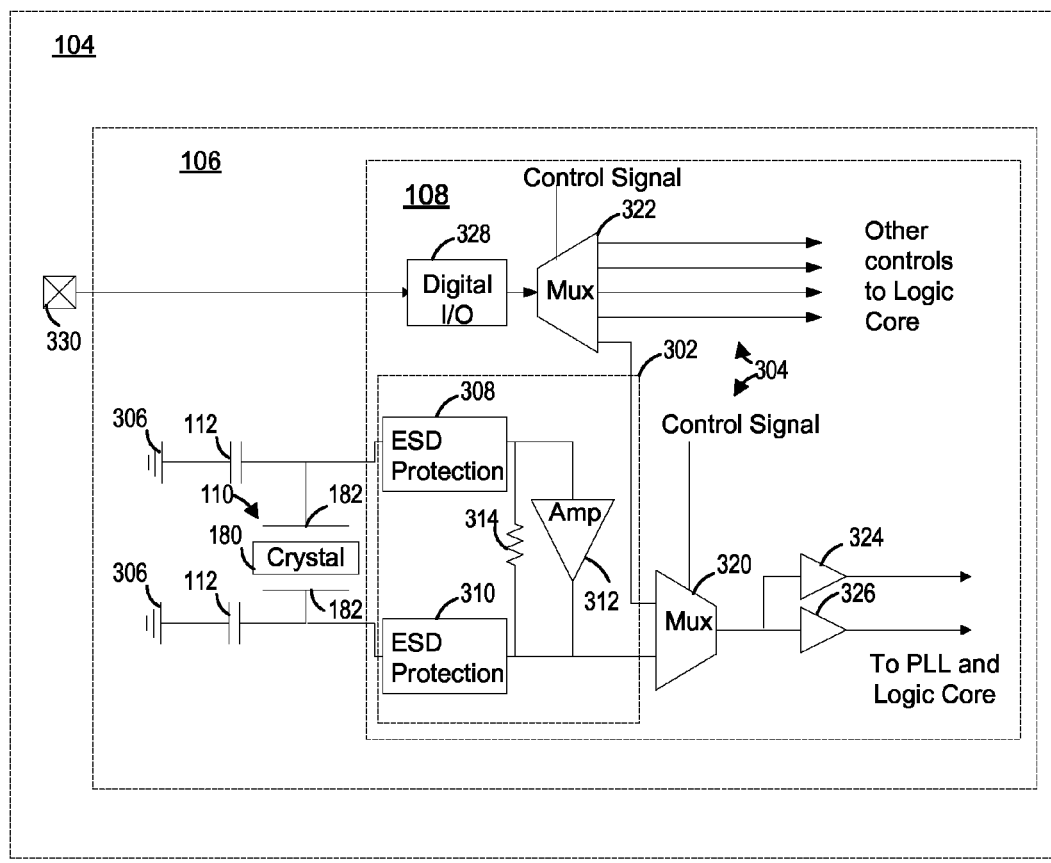
FIG. 3 is a schematic diagram of a portion of a system according to some embodiments.
Figure 4:
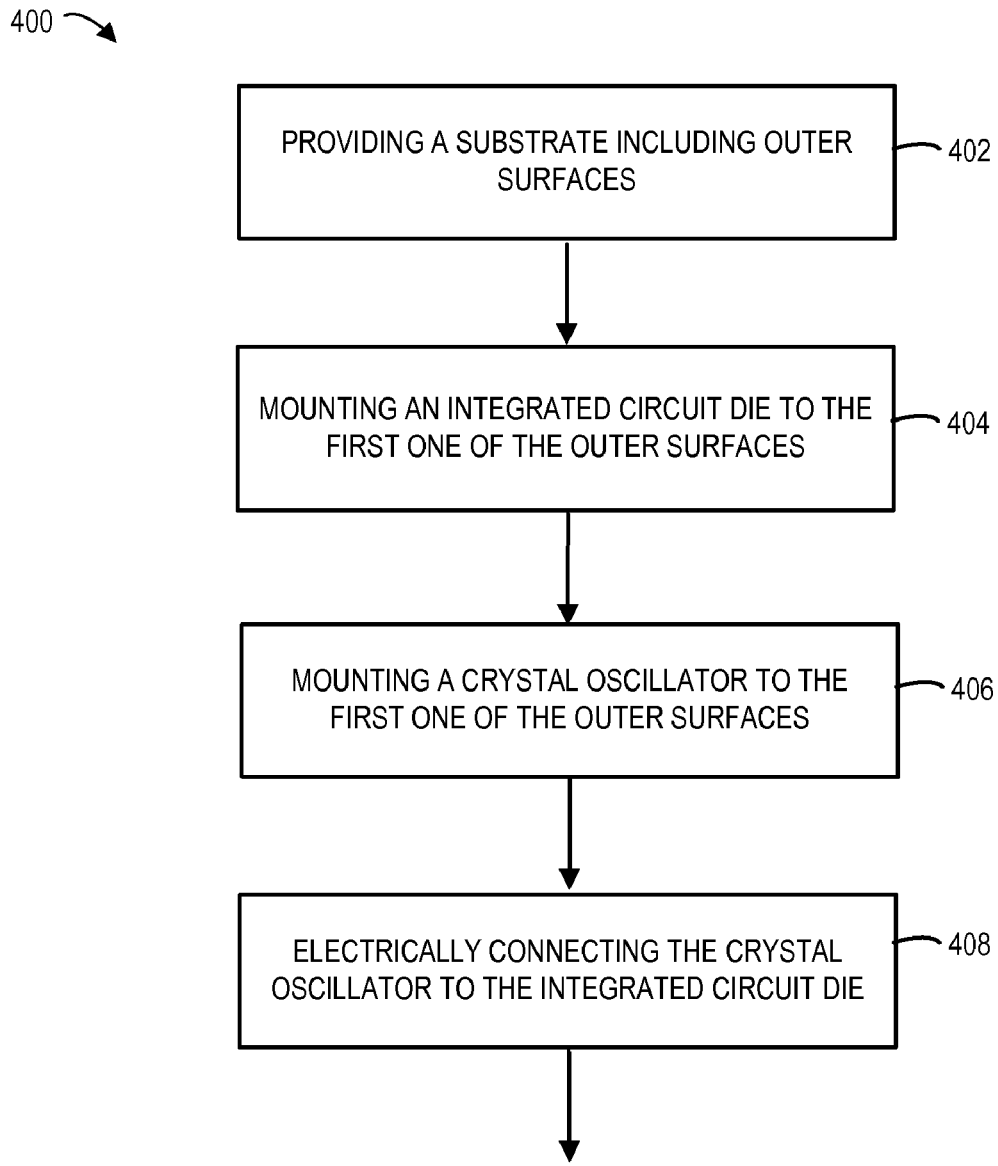
FIG. 4 is a flow diagram of a method according to some embodiments.

FIG. 3 is a schematic diagram of a portion of the system 100 that may be used in generating a clock signal for one or more circuits of the integrated circuit die 108, according to some embodiments. Referring to FIG. 4, the portion of the system 100 may include the crystal oscillator 110, capacitors 112A, 112B, sense/drive circuitry 302 and support/selection circuitry 304.

A first electrode 182 of the crystal oscillator 110 may be electrically connected to a first terminal of the first capacitor 112A. A second terminal of the first capacitor 112B may be electrically connected to a reference voltage 306, e.g., ground. A second electrode 182 of the crystal oscillator 110 may be electrically connected to a first terminal of the second capacitor 112B. A second terminal of the second capacitor 112B may be electrically connected to the reference voltage 306, ground.

The sense/drive circuitry 302 may include ESD protection circuitry and gain circuitry. The ESD protection circuitry may include a first ESD protection circuit 308 and a second ESD protection circuit 310. The gain circuitry may include an amplifier 312 and feedback circuitry 314, e.g., a resistor. A first terminal of the first ESD protection circuit 308 may be electrically connected to the first electrode 182 of the crystal oscillator. A second terminal of the first ESD protection circuitry 308 may be electrically connected to a first terminal of the amplifier 312. A second terminal of the amplifier 312 may be electrically connected to a first terminal of the feedback circuitry 314. A second terminal of the feedback circuitry 314 may be electrically connected to the first terminal of the amplifier 312. A second terminal of the amplifier 312 may also be electrically connected to a first terminal of the second ESD protection circuit 310. A second terminal of the ESD protection circuit 310 may be electrically connected to the second electrode 182 of the crystal oscillator 110.

The support/selection circuitry 304 may include a first multiplexer 320, a second multiplexer 322, a first buffer 324, a second buffer 326 and I/O circuitry 328. A first input terminal of the first multiplexer 320 may be electrically connected to the second terminal of the amplifier 312. An output terminal of the first multiplexer 320 may be electrically connected to an input terminal of the first buffer 324 and an input terminal of the second buffer 326. An output terminal of the first buffer 324 and an output terminal of the second buffer 326 may be electrically connected to a logic core of the integrated circuit die 108.

A second input terminal of the first multiplexer 320 may be electrically connected an output terminal of the second multiplexer 322, other output terminals of which may be electrically connected to the logic core. An input terminal of the second multiplexer 322 may be electrically connected to an output terminal of the I/O circuitry 328, an input terminal of which may be electrically connected to a terminal 330 on the circuit board 104 and/or external to the integrated circuit package 102, which may be electrically connected to and supply an alternative clock signal 330.

A control terminal of the first multiplexer 320 may be electrically connected to control circuitry that provides a first control signal. A control terminal of the second multiplexer 322 may be electrically connected to control circuitry that provides a second control signal. In some embodiments, the second control signal comprises a five bit signal.

In some embodiments, the operation is as follows. A signal from the sense/drive circuitry 302 induce a time varying electrostatic force that causes the resonator 180 of the crystal oscillator 110 to oscillate mechanically at a resonant frequency. The oscillation results in an oscillating, i.e., time varying, signal, at the first electrode 182 of the crystal oscillator 110. The oscillating signal is supplied to the sense/drive circuitry 302, which amplifies the oscillating signal to generate a clock signal. The clock signal is fed (i.e., supplied) back to the crystal oscillator 310 to sustain the oscillation thereof. The clock signal is also supplied to the first input terminal of the first multiplexer 320, which is controlled by the control signal supplied to the control terminal thereof.

If the integrated circuit die 108 is not in a test mode, the first control signal has a logic state that causes the first multiplexer 320 to select the clock signal from the sense/drive circuit 302 and supply the clock signal to the output terminal of the first multiplexer 320. The clock signal at the output terminal of the first multiplexer 320 is supplied to the first and second buffers 324, 326, which buffer the clock signal and supply the clock signal to the PLL and logic core, respectively.

If, on the other hand, the integrated circuit die 108 is in a test mode, the terminal 330 supplies the alternative clock signal to the I/O circuitry 328, which in turn supplies the alternative clock signal to the input terminal of the second multiplexer 322. The control signal supplied to the control terminal of the second multiplexer 322 has a logic state that causes the second multiplexer 322 to select the alternative clock signal and supply the alternative clock signal to the output terminal of the second multiplexer 322. The alternative clock signal is supplied from the output terminal of the second multiplexer 322 to the second input terminal of the first multiplexer 320. The first control signal has a logic state that causes the first multiplexer 320 to select the alternative clock signal and supply the alternative clock signal to the output terminal of the first multiplexer 320. The alternative clock signal at the output terminal of the first multiplexer 320 is supplied to the first and second buffers 324, 326, which buffer the alternative clock signal and supply the alternative clock signal to the PLL and logic core, respectively.

Thus, in some embodiments, the integrated circuit package has two operating modes. If the integrated circuit package is not in the test mode, the clock signal supplied to the one or more circuits is based at least in part on the signal from the crystal oscillator. If the integrated circuit package is in the test mode, the clock signal supplied to the one or more circuits is based at least in part on an alternative clock signal. In some embodiments, such test mode may allow the integrated circuit die 108 to be tested independently from the crystal oscillator 110.

In some embodiments, the integrated circuit package 102 further comprises one or more additional integrated circuit die (not shown). One or more of such additional integrated circuit die may be electrically connected to the integrated circuit die 108.

In some embodiments, the system 100 further comprises one or more additional integrated circuit packages (not shown). One or more of such additional integrated circuit packages may be mounted on the circuit board 104. One or more of such additional integrated circuit packages may be electrically connected to the integrated circuit package 102.

In some embodiments, the system 100 further comprises one or more additional circuit boards (not shown). One or more integrated circuit packages may be mounted on one or more of such additional integrated circuit boards.

The integrated circuit package 102 may be fabricated using any suitable fabrication technique and may provide any functions to system 100. In some embodiments, the one or more circuits of the integrated circuit die 108 define a processor. In some embodiments, a processor comprises a microprocessor and/or communication processor.

As used herein, a microprocessor may comprise any type of microprocessor. For example, a microprocessor may be programmable or non programmable, general purpose or special purpose, dedicated or non dedicated, distributed or non distributed, shared or not shared, and/or any combination thereof. A microprocessor may include, but is not limited to, hardware, software, firmware, and/or any combination thereof. Software may include, but is not limited to, instructions stored on a computer readable medium, such as, for example, punch cards, paper tape, magnetic or optical disk, magnetic or optical tape, CD-ROM, DVD, RAM, EPROM, or ROM. A microprocessor may employ continuous signals, periodically sampled signals, and/or any combination thereof.

As used herein, a communication processor may comprise any type of communication processor. For example, a communication processor may be programmable or non programmable, general purpose or special purpose, dedicated or non dedicated, distributed or non distributed, shared or not shared, and/or any combination thereof. A communication processor may include, but is not limited to, hardware, software, firmware, and/or any combination thereof. Software may include, but is not limited to, instructions stored on a computer readable medium, such as, for example, punch cards, paper tape, magnetic or optical disk, magnetic or optical tape, CD-ROM, DVD, RAM, EPROM, or ROM. A communication processor may employ continuous signals, periodically sampled signals, and/or any combination thereof.

In some embodiments, a communication processor is adapted to perform one or more communication intensive processes.

FIG. 4 is a flow diagram of a method 400 according to some embodiments. In some embodiments, portions of method 400 may be performed by different entities. In some embodiments, one or more portions of method 400 may be performed by an integrated circuit manufacturer. In some embodiments, one or more portions of method 400 may be performed by a system integrator. In some embodiments, one or more portions of method 400 may be performed manually.

Referring to FIG. 4, at 402, the method may include providing a substrate including outer surfaces. A first one of the outer surfaces may define a first plurality of electrical contacts. A second one of the outer surfaces may be adapted to be mounted to a circuit board and may define a second plurality of electrical contacts adapted to be electrically connected to the circuit board.

At 404, the method may further include mounting an integrated circuit die to the first one of the outer surfaces. In some embodiments, bump contacts are used to mount the integrated circuit die to the outer surface. In some other embodiments, wirebond type connections (sometimes referred to herein as bond wires) are used to mount the integrated circuit die to the outer surface.

At 406, the method may further include mounting a crystal oscillator to the first one of the outer surfaces.

At 408, the method may further include electrically connecting the crystal oscillator to the integrated circuit die.

In some embodiments, one or more portions of one or more embodiments disclosed herein may be embodied in a method, an apparatus and/or a system.

Unless otherwise stated, terms such as, for example, "in response to" and "based on" mean "in response at least to" and "based at least on", respectively, so as not to preclude being responsive to and/or based on, more than one thing.

Unless otherwise stated, terms such as, for example, "electrically connected" mean "directly electrically connected" and/or "indirectly electrically connected".

In addition, unless stated otherwise, terms such as, for example, "comprises", "has", "includes", and all forms thereof, are considered open-ended, so as not to preclude additional elements and/or features. In addition, unless stated otherwise, terms such as, for example, "a", "one", "first", are considered open-ended, and do not mean "only a", "only one" and "only a first", respectively. Moreover, unless stated otherwise, the term "first" does not, by itself, require that there also be a "second".

The several embodiments described herein are solely for the purpose of illustration. Other embodiments may be practiced with modifications and alterations limited only by the claims.

What is claimed is:

1. Apparatus comprising:
   a substrate including outer surfaces, one of the outer surfaces defining a first plurality of electrical contacts, one of the outer surfaces adapted to be mounted to a circuit board and defining a second plurality of electrical contacts adapted to be electrically connected to the circuit board;
   an integrated circuit die mounted to one of the outer surfaces of the substrate,
   a crystal oscillator mounted to one of the outer surfaces of the substrate and electrically connected to the integrated circuit die, the crystal oscillator comprising:
   a mechanical resonator; and
   a case mounted to one of the outer surfaces of the substrate and within which the mechanical resonator of the crystal oscillator is disposed,
   first circuitry including circuitry to receive an oscillating signal supplied by the crystal oscillator, to generate a feedback signal based at least in part on the oscillating signal, and to supply the feedback signal to the crystal oscillator, the first circuitry comprising:
   circuitry to generate a clock signal based at least in part on the oscillating signal and to supply the clock signal to at least one circuit of the integrated circuit die, and
   a terminal to receive an alternative clock signal that is not generated based at least in part on the oscillating signal supplied by the crystal oscillator.

2. The apparatus of claim 1 wherein the outer surfaces are opposite outer surfaces.

3. The apparatus of claim 1 wherein the outer surfaces are opposite major outer surfaces.

4. The apparatus of claim 1 wherein the integrated circuit die comprises a microprocessor.

5. The apparatus of claim 1 wherein the resonator oscillates mechanically at a resonant frequency.

6. The apparatus of claim 1 wherein the integrated circuit die includes at least a portion of the first circuitry.

7. The apparatus of claim 1 wherein the first circuitry further comprises:

a multiplexer to receive the clock signal based at least in part on the oscillating signal and to select the received clock signal in response to a control signal.

8. A method comprising:
providing a substrate including outer surfaces, one of the outer surfaces defining a first plurality of electrical contacts, one of the outer surfaces adapted to be mounted to a circuit board and defining a second plurality of electrical contacts adapted to be electrically connected to the circuit board;
mounting an integrated circuit die to one of the outer surfaces of the substrate, mounting a crystal oscillator to one of the outer surfaces of the substrate;
electrically connecting the crystal oscillator to the integrated circuit die;
receiving an oscillating signal supplied by the crystal oscillator;
generating a feedback signal based at least in part on the oscillating signal;
supplying the feedback signal to the crystal oscillator;
generating a clock signal based at least in part on the oscillating signal;
supplying the clock signal to at least one circuit of the integrated circuit die; and
receiving an alternative clock signal that is not generated based at least in part on the oscillating signal supplied by the crystal oscillator;
wherein the crystal oscillator comprises:
a mechanical resonator; and
a case mounted to one of the outer surfaces of the substrate and within which the mechanical resonator of the crystal oscillator is disposed.

9. The method of claim 8 wherein the outer surfaces are opposite outer surfaces.

10. The method of claim 8 wherein the outer surfaces are opposite major outer surfaces.

11. The method of claim 8 wherein the integrated circuit die comprises a microprocessor.

12. The method of claim 8 wherein the resonator oscillates mechanically at a resonant frequency.

13. The method of claim 8 further comprising:
selecting the supplied clock signal in response to a control signal.

14. A system comprising:
a circuit board;
a substrate including outer surfaces, one of the outer surfaces defining a first plurality of electrical contacts, one of the outer surfaces adapted to be mounted to the circuit board and defining a second plurality of electrical contacts adapted to be electrically connected to the circuit board;
an integrated circuit die mounted to one of the outer surfaces of the substrate,
a crystal oscillator mounted to one of the outer surfaces of the substrate and electrically connected to the integrated circuit die, the crystal oscillator comprising:
a mechanical resonator; and
a case mounted to one of the outer surfaces of the substrate and within which the mechanical resonator of the crystal oscillator is disposed,
first circuitry including circuitry to receive an oscillating signal supplied by the crystal oscillator, to generate a feedback signal based at least in part on the oscillating signal, and to supply the feedback signal to the crystal oscillator, the first circuitry comprising:
circuitry to generate a clock signal based at least in part on the oscillating signal and to supply the clock signal to at least one circuit of the integrated circuit die, and
a terminal to receive an alternative clock signal that is not generated based at least in part on the oscillating signal supplied by the crystal oscillator.

15. The system of claim 14 wherein the outer surfaces are opposite outer surfaces.

16. The system of claim 14 wherein the outer surfaces are opposite major outer surfaces.

17. The apparatus of claim 1 wherein the crystal oscillator that comprises the mechanical resonator is mounted on a mounting area defined by the substrate.

18. The apparatus of claim 1 wherein the crystal oscillator that comprises the mechanical resonator is soldered to contacts on the substrate.

19. The apparatus of claim 1 wherein the substrate is a substrate for an integrated circuit package that includes the crystal oscillator that comprises the mechanical resonator.

20. The method of claim 8 wherein mounting the crystal oscillator that comprises the mechanical resonator to one of the outer surfaces of the substrate comprises:
mounting the crystal oscillator that comprises the mechanical resonator on a mounting area defined by the substrate.

21. The method of claim 8 wherein mounting the crystal oscillator that comprises the mechanical resonator to one of the outer surfaces of the substrate comprises:
soldering the crystal oscillator that comprises the mechanical resonator to contacts on the substrate.

22. The method of claim 8 wherein providing the substrate comprises:
providing an integrated circuit package that includes the substrate; and
wherein
mounting the crystal oscillator that comprises the mechanical resonator to one of the outer surfaces of the substrate comprises:
mounting the crystal oscillator that comprises the mechanical resonator in the integrated circuit package.

23. The system of claim 14 wherein the crystal oscillator that comprises the mechanical resonator is mounted on a mounting area defined by the substrate.

24. The system of claim 14 wherein the crystal oscillator that comprises the mechanical resonator is soldered to contacts on the substrate.

25. The system of claim 14 wherein the substrate is a substrate for an integrated circuit package that includes the crystal oscillator that comprises the mechanical resonator.

26. The apparatus of claim 1 wherein the first circuitry further comprises:
a first multiplexer having a first input terminal and a second input terminal, the first input terminal to receive the clock signal that is generated based at least in part on the oscillating signal supplied by the crystal oscillator, the second input terminal to receive the alternative clock signal that is not generated based at least in part on the oscillating signal supplied by the crystal oscillator.

27. The apparatus of claim 26 wherein the first multiplexer is to select the clock signal that is based at least in part on the oscillating signal if a control signal has a first logic state and to select the alternative clock signal if the control signal has a second logic state.

28. The apparatus of claim 26 wherein the first circuitry further comprises:
a second multiplexer having an input terminal and an output terminal, the input terminal of the second multiplexer to receive the alternative clock signal that is not generated based at least in part on the oscillating signal supplied by the crystal oscillator, the output terminal of the second multiplexer to supply the alternative clock signal to the second input terminal of the first multiplexer.

29. The apparatus of claim 28 wherein the output terminal of the second multiplexer is one of a plurality of output terminals of the second multiplexer.

30. The apparatus of claim 29 wherein only one of the plurality of output terminals of the second multiplexer is to supply a signal to the first multiplexer.

31. The apparatus of claim 28 wherein the first circuitry further comprises:
I/O circuitry having an input terminal and an output terminal, the input terminal of the I/O circuitry to electrically connect to a terminal on the circuit board and to receive the alternative clock signal from the terminal on the circuit board, the output terminal of the I/O circuitry to supply the alternative clock signal to the input terminal of the second multiplexer.

32. The apparatus of claim 1 further comprising:
a lid;
wherein the lid and the substrate collectively define a seal around the integrated circuit die and the crystal oscillator.

33. The apparatus of claim 32 wherein the seal is a hermetic seal.

34. The method of claim 8 further comprising:
providing a lid;
wherein the lid and the substrate collectively define a seal around the integrated circuit die and the crystal oscillator.

35. The method of claim 34 wherein the seal is a hermetic seal.

36. The system of claim 14 further comprising:
a lid;
wherein the lid and the substrate collectively define a seal around the integrated circuit die and the crystal oscillator.

37. The system of claim 36 wherein the seal is a hermetic seal.

38. The method of claim 8 wherein the at least one circuit of the integrated circuit die comprises:
a first multiplexer having a first input terminal and a second input terminal, the first input terminal to receive the clock signal that is generated based at least in part on the oscillating signal supplied by the crystal oscillator, the second input terminal to receive the alternative clock signal that is not generated based at least in part on the oscillating signal supplied by the crystal oscillator.

39. The method of claim 38 wherein the at least one circuit of the integrated circuit die further comprises:
a second multiplexer having an input terminal and an output terminal, the input terminal of the second multiplexer to receive the alternative clock signal that is not generated based at least in part on the oscillating signal supplied by the crystal oscillator, the output terminal of the second multiplexer to supply the alternative clock signal to the second input terminal of the first multiplexer.

40. The method of claim 39 wherein the at least one circuit of the integrated circuit die further comprises:
I/O circuitry having an input terminal and an output terminal, the input terminal of the I/O circuitry to electrically connect to a terminal on the circuit board and to receive the alternative clock signal from the terminal on the circuit board, the output terminal of the I/O circuitry to supply the alternative clock signal to the input terminal of the second multiplexer.

41. The system of claim 14 wherein the first circuitry further comprises:
a first multiplexer having a first input terminal and a second input terminal, the first input terminal to receive the clock signal that is generated based at least in part on the oscillating signal supplied by the crystal oscillator, the second input terminal to receive the alternative clock signal that is not generated based at least in part on the oscillating signal supplied by the crystal oscillator.

* * * * *